(12) United States Patent
Huang et al.

(10) Patent No.: US 12,278,253 B2
(45) Date of Patent: Apr. 15, 2025

(54) BACKSIDE DIODE DESIGN

(71) Applicant: Taiwan Semiconductor Manufacturing Company, Ltd., Hsinchu (TW)

(72) Inventors: Kuo-Chin Huang, Yilan (TW);
Tzu-Jui Wang, Fengshan (TW);
Hua-Mao Chen, Tainan (TW);
Chin-Chia Kuo, Tainan (TW);
Yuichiro Yamashita, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 435 days.

(21) Appl. No.: 17/566,183

(22) Filed: Dec. 30, 2021

(65) Prior Publication Data
US 2022/0278161 A1    Sep. 1, 2022

Related U.S. Application Data

(60) Provisional application No. 63/154,401, filed on Feb. 26, 2021.

(51) Int. Cl.
*H01L 27/146* (2006.01)
*H01L 31/107* (2006.01)

(52) U.S. Cl.
CPC .. *H01L 27/14636* (2013.01); *H01L 27/14627* (2013.01); *H01L 31/107* (2013.01)

(58) Field of Classification Search
CPC ......... H01L 27/14636; H01L 27/14627; H01L 31/107; H01L 31/02005; H01L 31/02327;
(Continued)

(56) References Cited

U.S. PATENT DOCUMENTS

2014/0042298 A1    2/2014    Wan et al.
2016/0020170 A1    1/2016    Ho et al.
(Continued)

FOREIGN PATENT DOCUMENTS

DE    102018122925 A1    4/2019
KR    20090071171 A    7/2009
(Continued)

*Primary Examiner* — Mohammad A Rahman
(74) *Attorney, Agent, or Firm* — Sterne, Kessler, Goldstein & Fox P.L.L.C.

(57) ABSTRACT

The present disclosure describes a semiconductor device that includes a first die bonded to a second die with interconnect structures in the first die. The first die includes a photodiode having first and second electrodes on a first side of a first dielectric layer, and first, second, and third interconnect structures in the first dielectric layer. The first and second interconnect structures are connected to the first and second electrodes, respectively. The second electrode has a polarity opposite to the first electrode. The second and third interconnect structures extend to a second side opposite to the first side of the first dielectric layer. The second die includes a second dielectric layer and a fourth interconnect structure in the second dielectric layer. The second dielectric layer is bonded to the second side of the first dielectric layer. The fourth interconnect structure connects the second and third interconnect structures.

20 Claims, 12 Drawing Sheets

(58) Field of Classification Search
CPC ......... H01L 27/14643; H01L 27/14683; H01L 25/0652; H01L 25/0655; H01L 27/14618; H01L 27/14634
See application file for complete search history.

(56) References Cited

U.S. PATENT DOCUMENTS

| | | |
|---|---|---|
| 2019/0259815 A1 | 8/2019 | Kataoka et al. |
| 2020/0135776 A1 | 4/2020 | Finkelstein |
| 2020/0227582 A1 | 7/2020 | Yamashita |
| 2021/0043688 A1 | 2/2021 | Isono et al. |
| 2021/0043792 A1 | 2/2021 | Iwata |
| 2021/0384246 A1 | 12/2021 | Matsumoto |
| 2022/0262970 A1* | 8/2022 | Murakami ...... H01L 31/035272 |

FOREIGN PATENT DOCUMENTS

| | | |
|---|---|---|
| KR | 20140020708 A | 2/2014 |
| KR | 20160010274 A | 1/2016 |
| TW | 2020-27144 A | 7/2020 |

\* cited by examiner

BACKSIDE DIODE DESIGN

CROSS-REFERENCE TO RELATED APPLICATIONS

This application claims the benefit of U.S. Provisional Patent Application No. 63/154,401, titled "High Voltage Design in Backside Illumination Single Photon Avalanche Diode," filed Feb. 26, 2021, the disclosure of which is incorporated by reference in its entirety.

BACKGROUND

A single-photon avalanche diode (SPAD) is a solid-state photodetector having a reverse biased p-n junction that can be illuminated with incident radiation across a wide portion of the electromagnetic spectrum. An avalanche process can be triggered when the reverse biased p-n junction receives additional carriers, such as carriers generated by the incident radiation. For example, in order to detect radiations with low intensities, the p-n junction is biased above its breakdown voltage, thereby allowing a single photon-generated carrier to trigger an avalanche current that can be detected. Image sensors operating in this mode are known as single photon avalanche diode (SPAD) image sensors.

BRIEF DESCRIPTION OF THE DRAWINGS

Aspects of the present disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
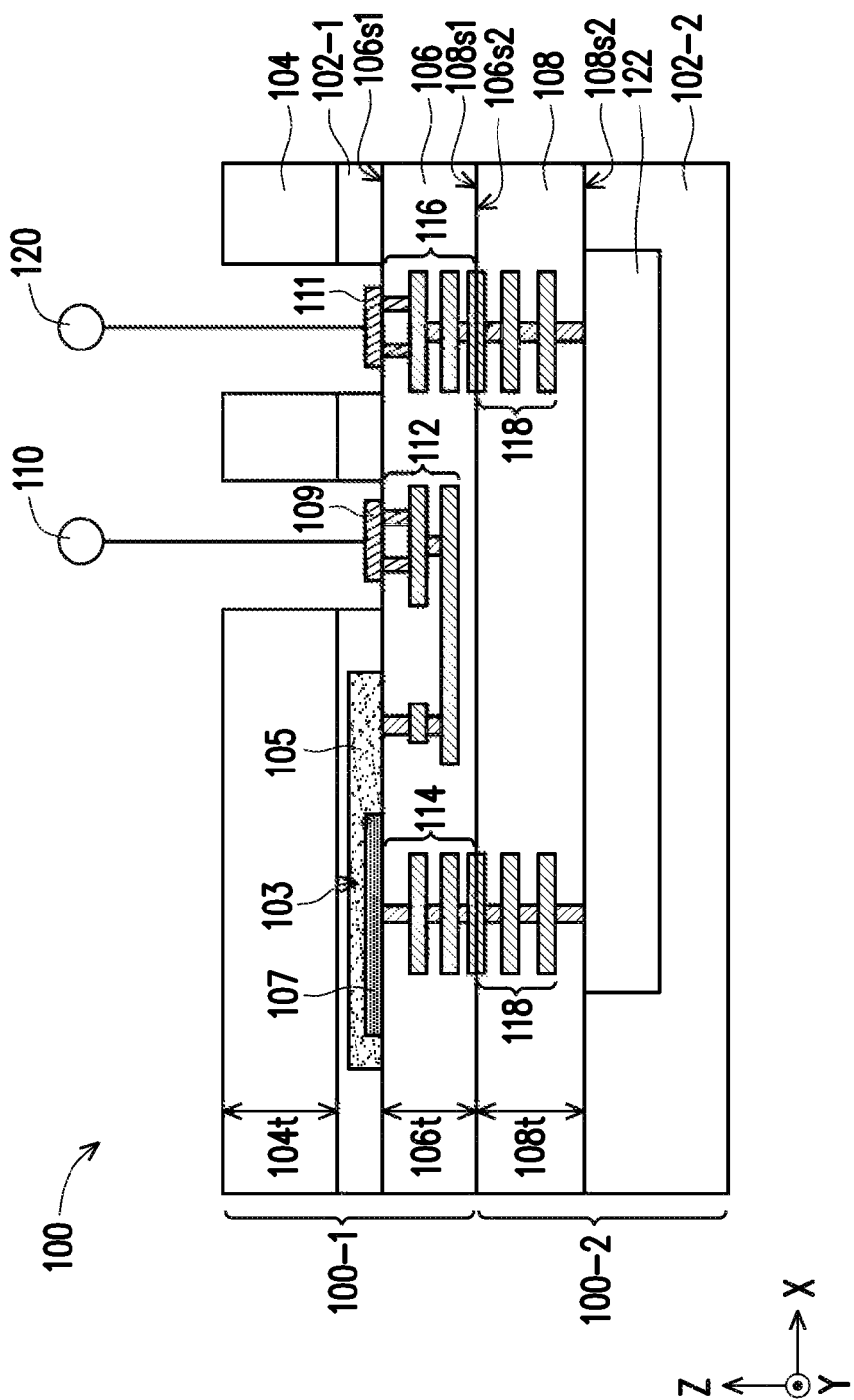
FIG. 1 illustrates a partial cross-sectional view of a semiconductor device that includes a first die bonded to a second die with interconnect structures contained within the first die, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Digital cameras and optical imaging devices employ image sensors. Image sensors convert optical images to digital data that may be represented as digital images. An image sensor can include an array of pixel sensors, which are unit devices for the conversion of an optical image into electrical signals. Pixel sensors can include charge-coupled devices (CCDs) or complementary metal oxide semiconductor (CMOS) devices.

A single photon avalanche diode (SPAD) image sensor can detect incident radiation with very low intensities (e.g., a single photon). The SPAD image sensor includes multiple SPAD cells arranged in an array. The SPAD cells can include a p-n junction and associated circuits for image signal processing and operation. The associated circuits can include a core circuit to process image signals from the SPAD and an input/output (I/O) circuit to pass the image signals. During the imaging process, the p-n junction can be reverse biased at a high voltage (e.g., from about 15 V to about 40 V), which can be above the p-n junction's breakdown voltage. During processing of the image signal, the operating voltage of the core circuit can range from about 0.5 V to about 1.5 V and the operating voltage of the I/O circuit can range from about 2.5 V to about 3.0 V. As a result, the associated circuits of the SPAD can operate at a low voltage (e.g., from about 0.5 V to about 3.0 V).

Image sensors can be fabricated on a wafer or a substrate, which can be diced into separate dies after the fabrication processes. Each die can include one image sensor. Front side illumination (FSI) SPAD image sensors integrate SPAD and associated image signal processing (ISP) circuits on a single die. The p-n junctions and associated circuits of FSI SPAD image sensors are arranged in a lateral, side-by-side manner and can be compatible with CMOS fabrication processes. FSI SPAD image sensors process both high-voltage operations, such as reverse biasing the SPAD at about 30 V, and low-voltage operations, such as processing image signals at about 1 V, on the same die. However, the lateral arrangement of the FSI SPAD image sensors can consume a significant amount of die area and limit further scaling down of FSI SPAD image sensors. Further, a design rule for devices processing high-voltage operations can be different from the design rule of devices processing low-voltage operations. These different design rules need to be considered during the design process of FSI SPAD image sensors. In addition, problems such as dielectric breakdown and signal interference may arise during manufacturing and/or operating processes.

Backside illumination (BSI) SPAD image sensors can have a SPAD array on a sensor die and associated circuits on an application-specific integrated circuit (ASIC) die. The high-voltage routings for interconnect structures of BSI SPAD image sensors can traverse through both the sensor die and the ASIC die, creating problems for circuit design and manufacturing.

Various embodiments of the present disclosure provide example BSI SPAD image sensors having a sensor die bonded to an ASIC die with high-voltage interconnect structures contained within the sensor die, and example methods to fabricate the example BSI SPAD image sensors. According to some embodiments, a first dielectric layer of the sensor die can be bonded to a second dielectric layer of the ASIC die. The sensor die can include a SPAD array on a first side of the first dielectric layer. The SPAD in the SPAD array can include a first electrode and a second electrode (e.g., cathode and anode). A first interconnect structure in the first dielectric layer can connect the first electrode to a high-voltage power supply providing a high voltage (e.g., from about 15 V to about 40 V). A second interconnect structure in the first dielectric layer can be connected to the second electrode. A third interconnect structure in the first dielectric layer can be connected to a fourth interconnect structure in the second dielectric layer on the ASIC die. A low-voltage power supply providing a low voltage (e.g., from about 0.5 V to about 3.0 V) can be connected to the third interconnect structure and can be supplied to the associated circuits on the ASIC die. The fourth interconnect structure can also be connected to the second interconnect structure. The second and fourth interconnect structures can connect the associated circuits on the ASIC die to the second electrode of the SPAD. In some embodiments, the associated circuits can be connected to the second electrode and the low-voltage power supply using a hybrid bond between the sensor die and the ASIC die. In some embodiments, the associated circuits can be connected to the second electrode and the low-voltage power supply using through vias. In some embodiments, the BSI SPAD image sensors can further include a micro-lens covering the SPAD to improve device performance High-voltage routings of the first interconnect structures can remain in the sensor die. The ASIC die can be free of high-voltage routings and may not process high-voltage operations. As a result, in some embodiments, the ASIC die does not include high-voltage routings and the development of ASIC die can avoid further qualification work for high-voltage metal verification and demonstration, which can reduce the development cycle time for the BSI SPAD image sensors. In addition, handling high-voltage metal routings on the sensor die with a different metal rule (e.g., associated with a higher technology node, such as above about 45 nm) can reduce manufacturing cost from handling both high-voltage and low-voltage metal routings on the ASIC die with a restrictive metal rule (e.g., associated with a lower technology node, such as below about 45 nm).

FIG. 1 illustrates a partial cross-sectional view of a semiconductor device 100 that includes a first die 100-1 bonded to a second die 100-2 with a high-voltage interconnect structures contained within first die 100-1, in accordance with some embodiments. In some embodiments, the partial cross-sectional view of FIG. 1 can illustrate a sensor die bonded to an ASIC die. In some embodiments, first die 100-1 can include a substrate 102-1, a first dielectric layer 106, a SPAD 103 on first dielectric layer 106, and a passivation layer 104 on SPAD 103. First die 100-1 can further include a first interconnect structure 112, a second interconnect structure 114, and a third interconnect structure 116 in first dielectric layer 106. First interconnect structure 112 can be connected to a high-voltage power supply 110 providing a high voltage (e.g., from about 15 V to about 40 V). Third interconnect structure 116 can be connected to a low-voltage power supply 120 providing a low voltage (e.g., from about 0.5 V to about 3.0 V). Second die 100-2 can include a substrate 102-2, a second dielectric layer 108, a fourth interconnect structure 118 in second dielectric layer 108, and associated circuits 122.

Substrates 102-1 and 102-2 can each include a semiconductor material, such as silicon and germanium. In some embodiments, substrates 102-1 and 102-2 can include a crystalline silicon substrate (e.g., wafer). In some embodiments, substrates 102-1 and 102-2 can include (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. In some embodiments, substrates 102-1 and 102-2 can include the same semiconductor material. In some embodiments, substrates 102-1 and 102-2 can include semiconductor materials different from each other. Further, substrates 102-1 and 102-2 can be doped depending on design requirements (e.g., p-type substrate or n-type substrate). In some embodiments, substrates 102-1 and 102-2 can include silicon and can be doped with p-type dopants (e.g., boron, indium, aluminum, or gallium) or n-type dopants (e.g., phosphorus or arsenic).

Referring to FIG. 1, SPAD 103 can be disposed in substrate 102-1 on a first side 106$s$1 of first dielectric layer 106. SPAD 103 can include a first electrode 105 and a second electrode 107. Second electrode 107 can have a polarity opposite to that of first electrode 105. In some embodiments, first electrode 105 can be a cathode and second electrode 107 can be an anode. In some embodiments, first electrode 105 can be an anode and second electrode 107 can be a cathode. In some embodiments, first electrode 105 can be doped n-type and second electrode 107 can be doped p-type. In some embodiments, first electrode 105 can be doped p-type and second electrode 107 can be doped n-type. A p-n junction formed at an interface of the first electrode 105 and second electrode 107 can be reversed biased for an imaging process. In some embodiments, during the imaging process, first electrode 105 can be biased at a high voltage (e.g., from about 15 V to about 40 V), above the breakdown voltage of SPAD 103, for single photon detection. In some embodiments, SPAD 103 can be a pixel of an image sensor. An area of SPAD 103 can range from about 50×50 µm$^2$ to about 70×70 µm$^2$.

Passivation layer 104 can be disposed on substrate 102-1 and SPAD 103. In some embodiments, passivation layer 104 can include a dielectric material, such as silicon oxide (SiO$_x$), silicon oxynitride (SiON), silicon nitride (SiN$_x$), silicon oxycarbide (SiOC), silicon oxynitricarbide (SiOCN), and a combination thereof. Passivation layer 104 can passivate surfaces of substrate 102-1 and allow photons to pass through to SPAD 103. In some embodiments, passivation layer 104 can have a vertical dimension 104$t$ (e.g., thickness) along a Z-axis ranging from about 400 nm to about 800 nm. If vertical dimension 104$t$ is less than about 400 nm, the surfaces of substrate 102-1 may not be passivated by passivation layer 104. If vertical dimension 104$t$ is greater than about 800 nm, photons may take more time to traverse through passivation layer 104 and may affect the heat dispassion of semiconductor device 100.

As shown in FIG. 1, a second side 106$s$2 of first dielectric layer 106 is bonded to a first side 108$s$1 of second dielectric layer 108. Second side 106$s$2 is opposite to first side 106$s$1. In some embodiments, first and second dielectric layers 106 and 108 can include a dielectric material, such as SiO$_x$, SiON, SiN$_x$, SiOC, SiOCN, and a combination thereof. In some embodiments, first and second dielectric layers 106 and 108 can include the same dielectric material. In some embodiments, first and second dielectric layers 106 and 108 can include dielectric materials different from each other. In some embodiments, first and second dielectric layers 106 and 108 can include a stack of dielectric layers and can bond first die 100-1 to second die 100-2. In some embodiments, after bonding second side 106$s$2 of first dielectric layer 106 to first side 108$s$1 of second dielectric layer 108, fourth interconnect structure 118 can be bonded and electronically connected to second and third interconnect structures 114 and 116. The bond between first and second dies 100-1 and 100-2 can include a dielectric-to dielectric bond between first and second dielectric layers 106 and 108 and a metal-to-metal bond between second, third, and fourth interconnect structures 114, 116, and 118, for which the bond between first and second dies 100-1 and 100-2 can be referred to as a "hybrid bond." In some embodiments, the dielectric-to-dielectric bond can include an oxide-to-oxide bond. In some embodiments, first dielectric layer 106 can have a vertical dimension 106$t$ (e.g., thickness) along a Z-axis ranging from about 2 µm to about 8 µm. Second dielectric layer 108 can have a vertical dimension 108$t$ (e.g., thickness) along a Z-axis ranging from about 2 µm to about 8 µm.

Referring to FIG. 1, first interconnect structure 112, second interconnect structure 114, and third interconnect structure 116 can be in first dielectric layer 106 and fourth interconnect structure 118 can be in second dielectric layer 108. In some embodiments, each of first, second, third, and fourth interconnect structures 112, 114, 116, and 118 can include one or more metal lines and/or metal vias. First, second, third, and fourth interconnect structures 112, 114, 116, and 118 can include aluminum (Al), titanium nitride (TiN), tantalum nitride (TaN), tungsten (W), copper (Cu), and other suitable conductive materials. First, second, third, and fourth interconnect structures 112, 114, 116, and 118 can connect SPAD 103 and associated circuits 122 to high-voltage power supply 110 and low-voltage power supply 120, respectively.

First interconnect structure 112 can be connected to first electrode 105. Second interconnect structure 114 can be connected to second electrode 107 and can extend to second side 106$s$2 of first dielectric layer 106. Third interconnect structure 116 can extend to second side 106$s$2 of first dielectric layer 106. Fourth interconnect structure 118 can extend to first side 108$s$1 of second dielectric layer 108 and can be connected to second interconnect structure 114 and third interconnect structure 116. In some embodiments, a high voltage (e.g., from about 15 V to about 40 V) can be supplied to first electrode 105 through first interconnect structure 112.

According to some embodiments, first interconnect structure 112 can remain in first dielectric layer 106 of first die 100-1 and not traverse through second die 100-2. Therefore, first dielectric layer 106 can enclose first interconnect structure 112 and high-voltage routings of the first interconnect structures can be limited in first die 100-1 and second die 100-2 can be free of high-voltage routings and may not process high-voltage operations. As a result, in some embodiments, second die 100-2 does not include high-voltage routings and the development of associated circuits 122 on second die 100-2 can avoid further qualification work for high-voltage metal verification and demonstration, which can reduce the development cycle time for semiconductor device 100. In addition, handling high-voltage metal routings on first die 100-1 with a different metal rule (e.g., associated with a higher technology node, such as above about 45 nm) can reduce manufacturing cost from handling both high-voltage and low-voltage metal routings on second die 100-2 with a restrictive metal rule (e.g., associated with a lower technology node, such as below about 45 nm).

As shown in FIG. 1, associated circuits 122 can be disposed on a second side 108$s$2 of second dielectric layer 108 and connected to fourth interconnect structure 118. Second side 108$s$2 is opposite to first side 108$s$1. In some embodiments, associated circuits 122 can include one or more devices, such as MOSFETs, finFETs, gate-all-around (GAA) FETs, other active devices, passive devices, and interconnections to connect the one or more devices. Some devices of associated circuits 122 can form an I/O circuit to deliver image signals from SPAD 103 to associated circuits 122 and control signals from associated circuits 122 to SPAD 103. Some devices of associated circuits 122 can form a core circuit to process image signals from SPAD 103 and control SPAD 103. In associated circuits 122, the operating voltage of the core circuit can range from about 0.5 V to about 1.5 V and the operating voltage of the I/O circuit can range from about 2.5 V to about 3.0 V. Third and fourth interconnect structures 116 and 118 can connect associated circuits 122 to a low-voltage power supply providing a low voltage (e.g., from about 0.5 V to about 3.0 V). In some embodiments, associated circuits 122 can bias second electrode 107 at a ground voltage (e.g., 0 V) when SPAD 103 is not used in an operation. In some embodiments, associated circuits 122 can bias second electrode 107 at the voltage from low-voltage power supply 120. And first electrode 105 can be biased at a negative high voltage from high-voltage power supply 110. Therefore, a voltage difference between first electrode 105 and second electrode 107 can be above the breakdown voltage of SPAD 103 and reverse bias SPAD 103 to detect incident photons.

Referring to FIG. 1, semiconductor device 100 can further include a first pad 109 and a second pad 111. First pad 109 can be connected to first interconnect structure 112. High-voltage power supply 110 can provide a high voltage (e.g., from about 15 V to about 40 V). First pad 109 and first interconnect structure 112 can provide the high voltage from high-voltage power supply 110 to first electrode 105 of SPAD 103. Second pad 111 can be connected to third interconnect structure 116. Low-voltage power supply 120 can provide a low voltage (e.g., from about 0.5 V to about 3.0 V). Second pad 111, third interconnect structure 116, and fourth interconnect structure 118 can provide the low voltage from low-voltage power supply 120 to associated circuits 122. In some embodiments, first and second pads 109 and 111 can include Al, TiN, TaN, W, Cu, aluminum copper (AlCu), and other suitable conductive materials.

Figure 2:
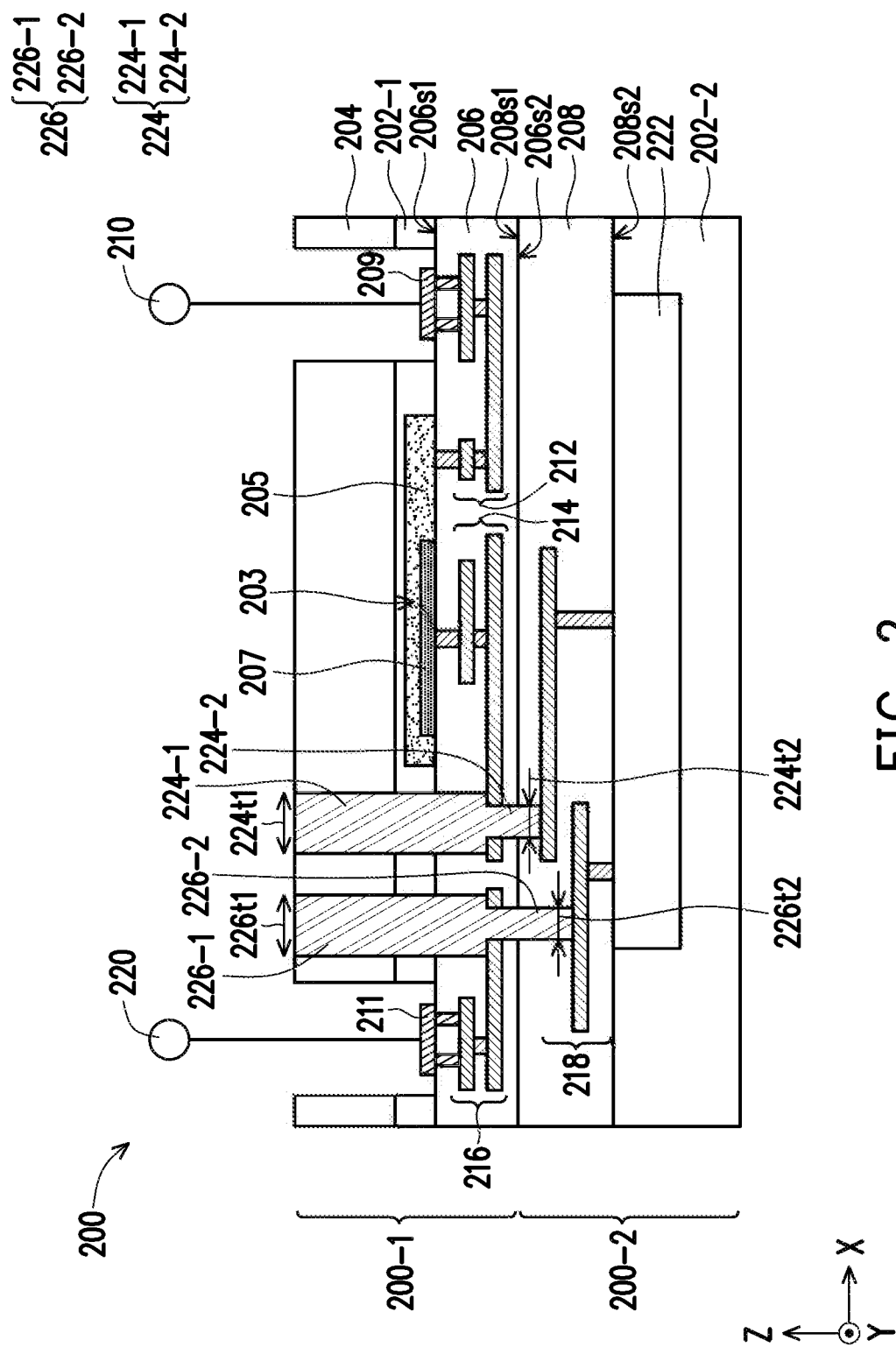
FIG. 2 illustrates a partial cross-sectional view of another semiconductor device that includes a first die bonded to a second die with interconnect structures contained within the first die, in accordance with some embodiments.

FIG. 2 illustrates a partial cross-sectional view of another semiconductor device 200 that includes a first die 200-1 bonded to a second die 200-2 with high-voltage interconnect structures contained within first die 200-1, in accordance with some embodiments. In some embodiments, first die 200-1 can include a substrate 202-1, a first dielectric layer 206, a SPAD 203 on first dielectric layer 206, and a passivation layer 204 on SPAD 203. First die 200-1 can further include a first interconnect structure 212, a second interconnect structure 214, and a third interconnect structure 216 in first dielectric layer 206. First interconnect structure 212 can be connected to a high-voltage power supply 210 providing a high voltage (e.g., from about 15 V to about 40 V). Third interconnect structure 216 can be connected to a low-voltage power supply 220 providing a low voltage (e.g., from about 0.5 V to about 3.0 V). Second die 200-2 can include a substrate 202-2, a second dielectric layer 208, a fourth interconnect structure 218 in second dielectric layer 208, and associated circuits 222. First die 200-1 and second die 200-2 can be bonded through a dielectric-to-dielectric bond of first dielectric layer 206 and second dielectric layer 208. First die 200-1 and second die 200-2 can be connected through first and second through vias 224 and 226.

Substrates 202-1 and 202-2 can each include a semiconductor material similar to substrates 102-1 and 102-2. In some embodiments, substrates 202-1 and 202-2 can include the same semiconductor material. In some embodiments, substrates 202-1 and 202-2 can include semiconductor materials different from each other. SPAD 203 can be on a first side 206s1 of first dielectric layer 206 and can include a first electrode 205 and a second electrode 207, similar to SPAD 103. Passivation layer 204 can include a dielectric material similar to passivation layer 104. Passivation layer 204 can passivate surfaces of substrate 202-1 and allow photons to pass through to SPAD 203. First and second dielectric layers 206 and 208 can include a dielectric material similar to first and second dielectric layers 106 and 108. First, second, third, and fourth interconnect structures 212, 214, 216, and 218 can include one or more metal lines and/or metal vias. First, second, third, and fourth interconnect structures 212, 214, 216, and 218 can include conductive materials similar to first, second, third, and fourth interconnect structures 112, 114, 116, and 118. Associated circuits 222 can include one or more devices similar to associated circuits 122, such as MOSFETs, finFETs, GAA FETs, other active devices, passive devices, and interconnections to connect the one or more devices. Some devices of associated circuits 222 can form an I/O circuit to pass image signals from SPAD 203 to associated circuits 222 and control signals from associated circuits 222 to SPAD 203. Some devices of associated circuits 222 can form a core circuit to process image signals from SPAD 203 and control SPAD 203.

Referring to FIG. 2, first interconnect structure 212 can be connected to first electrode 205. Second interconnect structure 214 can be connected to second electrode 207 and first through via 224. Third interconnect structure 216 can be in first dielectric layer 206 and connected to second through via 226. First dielectric layer 206 can enclose first, second, and third interconnect structures 212, 214, and 216. Fourth interconnect structure 218 can be in second dielectric layer 208 and can be connected to first and second through vias 224 and 226. Through via 224 can be connected to through via 226 through fourth interconnect structure 218 and associated circuits 222. In some embodiments, high-voltage power supply 210 can supply a high voltage (e.g., from about 15 V to about 40 V) to first electrode 205 through first interconnect structure 212. A second side 206s2 of first dielectric layer 206 is bonded to a first side 208s1 of second dielectric layer 208. Second side 206s2 is opposite to first side 206s1. Associated circuits 222 on a second side 208s1 of second dielectric layer 208 can be connected to second electrode 207 of SPAD 203 through fourth interconnect structure 218, first through via 224, and second interconnect structure 214. Second side 208s2 is opposite to first side 208s1. Associated circuits 222 can also be connected to low-voltage power supply 220 through fourth interconnect structure 218, second through via 226, and third interconnect structure 216.

In some embodiments, first and second through vias 224 and 226 can include Al, TiN, TaN, W, Cu, AlCu, and other suitable conductive materials. In some embodiments, as shown in FIG. 2, first through via 224 can include a top portion 224-1 and a bottom portion 224-2. Second through via 226 can include a top portion 226-1 and a bottom portion 226-2. Top portions 224-1 and 226-1 can be disposed above second and third interconnect structures 214 and 216. Bottom portions 224-2 and 226-2 can be disposed between fourth interconnect structure 218 and second and third interconnect structures 214 and 216. Bottom portions 224-2 and 226-2 can be connected to second, third, and fourth interconnect structures 214, 216, and 218. In some embodiments, top portions 224-1 and 226-1 can have respective horizontal dimensions 224t1 and 226t1 (e.g., diameter) along an X-axis ranging from about 2 μm to about 6 μm. Bottom portions 224-2 and 226-2 can have respective horizontal dimensions 224t2 and 226t2 (e.g., diameter) along an X-axis ranging from about 0.5 μm to about 2 μm.

Figure 3:
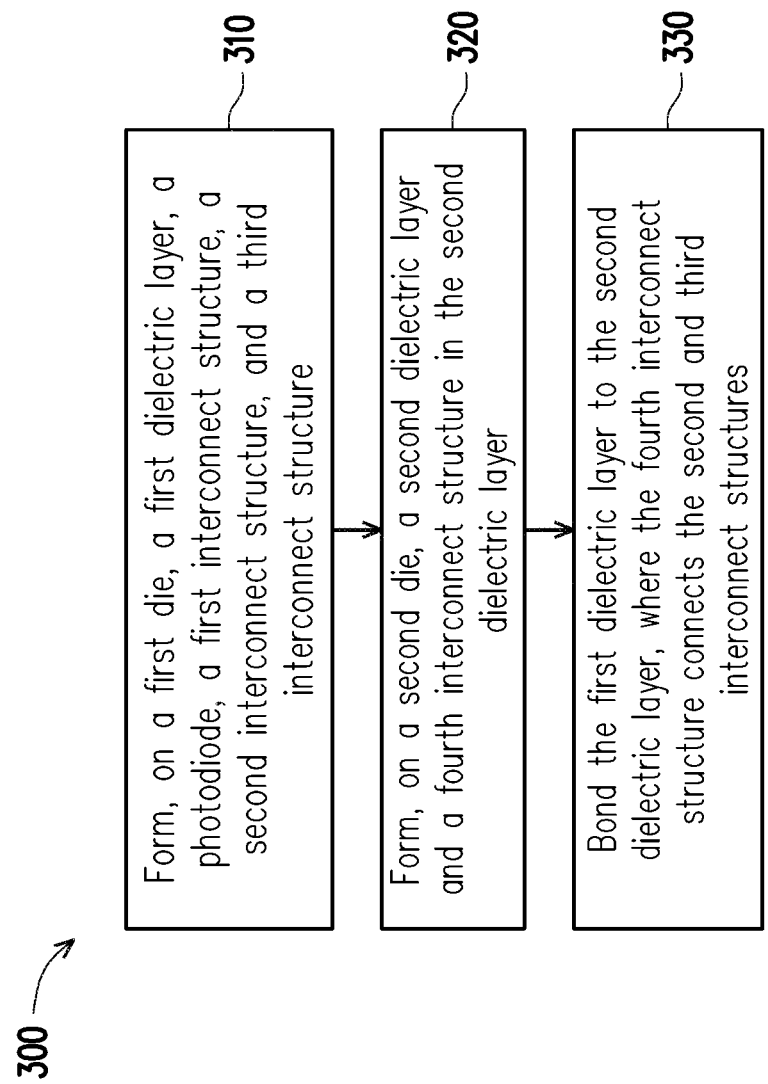
FIG. 3 is a flow diagram of a method for forming a semiconductor device that includes a first die bonded to a second die with interconnect structures contained within the first die, in accordance with some embodiments.

FIG. 3 is a flow diagram of an example method 300 for forming semiconductor device 100 that includes first die 100-1 bonded to second die 100-2 with high-voltage interconnect structures contained within first die 100-1, according to some embodiments. Method 300 may not be limited to the formation of semiconductor devices 100 and 200 and can be applicable to other BSI SPAD image sensors and fabrication processes. Additional processes may be performed between various operations of method 300 and may be omitted merely for clarity and ease of description. Additional processes can be provided before, during, and/or after method 300; one or more of these additional processes are briefly described herein. Moreover, not all operations may be needed to perform the disclosure provided herein. Additionally, some of the operations may be performed simultaneously or in a different order than shown in FIG. 3. In some embodiments, one or more other operations may be performed in addition to or in place of the presently described operations.

For illustrative purposes, the operations illustrated in FIG. 3 will be described with reference to the example fabrication process for forming semiconductor device 100 as illustrated in FIGS. 4-12. FIGS. 4-12 illustrate semiconductor device 100 having first die 100-1 bonded to second die 100-2 with high-voltage interconnect structures contained within first die 100-1 at various stages of its fabrication process, in accordance with some embodiment. Elements in FIGS. 4-12 with the same annotations as elements in FIG. 1 are described above.

Figure 4:
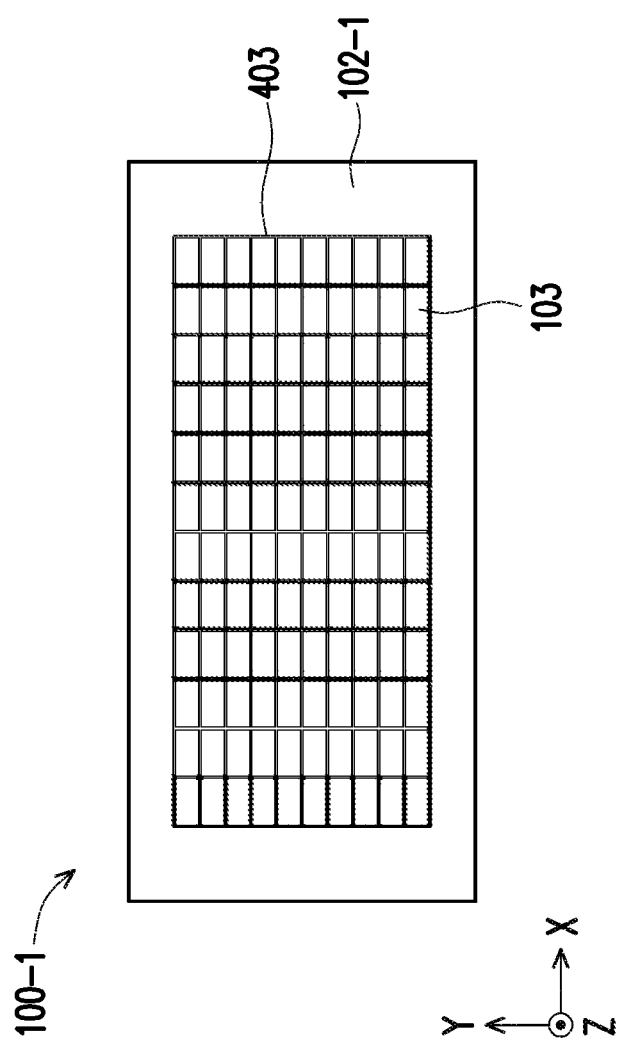
FIGS. 4-12 illustrate top and cross-sectional views of a semiconductor device having a first die bonded to a second die with interconnect structures contained within the first die at various stages of its fabrication process, in accordance with some embodiments.
Figure 5:
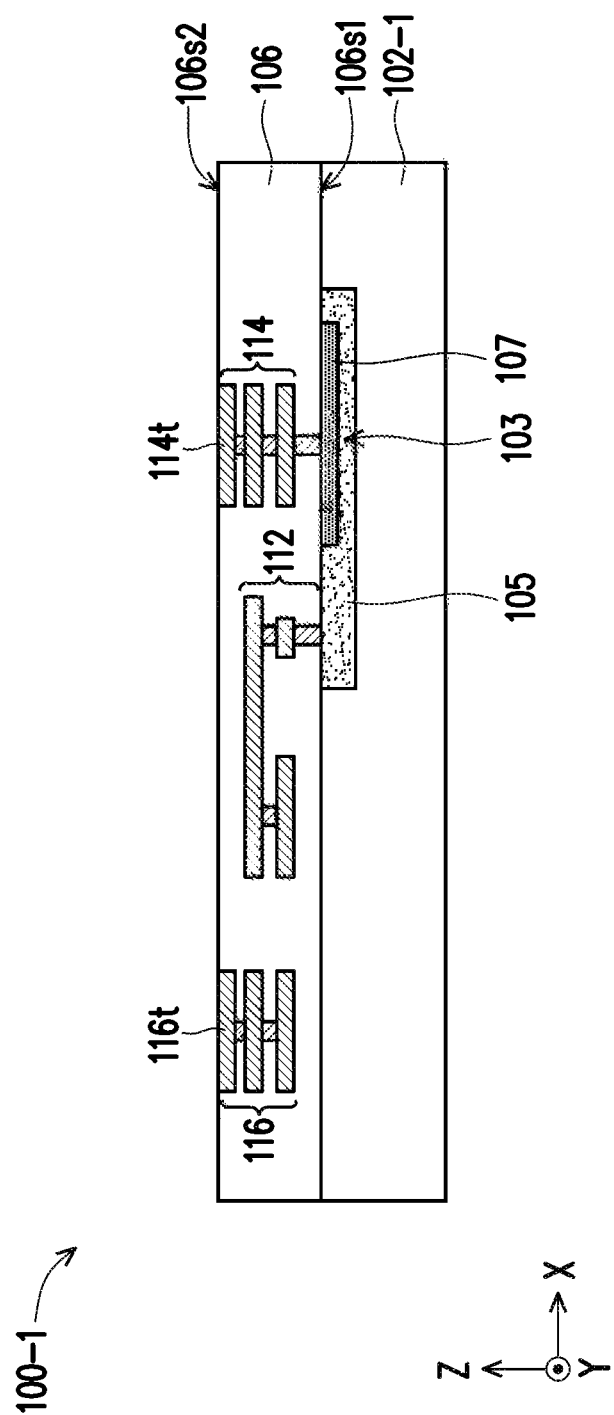

In referring to FIG. 3, method 300 begins with operation 310 and the process of forming, on a first die, a first dielectric layer, a photodiode, a first interconnect structure, a second interconnect structure, and a third interconnect structure. For example, as shown in FIGS. 4 and 5, first dielectric layer 106, SPAD 103, first interconnect structure 112, second interconnect structure 114, and third interconnect structure 116 can be formed on first die 100-1. FIGS. 4 and 5 illustrate a partial top view and a partial cross-sectional view of first die 100-1, respectively, in accordance with some embodiments. As shown in FIG. 4, a SPAD array 403 can include arrays of one or more SPADs 103. In some embodiments, the partial top view and partial cross-sectional view of FIGS. 4 and 5 can illustrate a sensor chip to detect incident photons.

In some embodiments, as shown in FIGS. 4 and 5, SPAD 103 can be formed on substrate 102-1 of first die 100-1. In some embodiments, substrate 102-1 can be a part of a bulk semiconductor wafer having a first conductivity type with a first doping concentration. For example, substrate 102-1 can be a part of a silicon wafer that is lightly doped with a p-type dopant, or lightly doped with an n-type dopant. SPAD 103 can be formed on substrate 102-1 by forming a series of doped regions. For example, SPAD 103 can be formed by doping a first region of a second conductivity type for first electrode 105 and doping a second region of the first conductivity type for second electrode 107. In some embodiments, the second region can be in the first region, as shown in FIG. 5. The second conductivity type can be opposite to the first conductivity type. For example, substrate 102-1 can be lightly doped with an n-type dopant, first electrode 105 can be doped with a p-type dopant, and second electrode 107 can be doped with an n-type dopant. In some embodiments, first electrode 105 and second electrode 107 can have a second doping concentration and a third doping concentration, respectively, higher than the first doping concentration of substrate 102-1. In some embodiments, first electrode 105 and second electrode 107 can be selectively doped by an ion implantation process using a patterned mask layer including photoresist. In some embodiments, first electrode 105 can have a first polarity and second electrode 107 can have a second polarity opposite to the first polarity. For example, first electrode 105 can be a cathode and second electrode 107 can be an anode. In some embodiments, first electrode 105 of SPAD 103 can be reversed biased at a high voltage (e.g., from about 15 V to about 40 V) to allow a single photon-generated carrier triggering an avalanche current that can be detected.

The formation of SPAD 103 can be followed by forming first dielectric layer 106 on substrate 102-1 and SPAD 103. In some embodiments, first dielectric layer 106 can be deposited on substrate 102-1 and SPAD 103 by physical vapor deposition (PVD), chemical vapor deposition (CVD), flowable chemical vapor deposition (FCVD), and other suitable deposition methods. In some embodiments, first dielectric layer 106 can include a dielectric material, such as $SiO_x$, SiON, $SiN_x$, SiOC, SiOCN, and a combination thereof. In some embodiments, first dielectric layer 106 can include one or more layers of dielectric materials.

The formation of first dielectric layer 106 can be followed by forming first interconnect structure 112, second interconnect structure 114, and third interconnect structure 116 in first dielectric layer 106. In some embodiments, first dielectric layer 106 can be etched to form via holes and/or metal trenches. The via holes and metal trenches can be filled with a conductive material to form metal vias and metal lines for first, second, and third interconnect structures 112, 114, and 116. In some embodiments, the metal vias and metal lines can be formed layer by layer, and each layer can be formed in a layer of dielectric material of first dielectric layer 106. In some embodiments, the metal vias and metal lines of first, second, and third interconnect structures 112, 114, and 116 can be formed using a deposition process and/or a plating process (e.g., electroplating, electro-less plating, etc.). In some embodiments, each of first, second, and third interconnect structures 112, 114, and 116 can include one or more layers of metal lines and/or metal vias. First, second, and third interconnect structures 112, 114, and 116 can include Al, TiN, TaN, W, Cu, and other suitable conductive materials.

After the formation of first, second, and third interconnect structures 112, 114, and 116 in first dielectric layer 106, SPAD 103 can have first electrode 105 and second electrode 107 on first side 106s1 of first dielectric layer 106. First interconnect structure 112 can be connected to first electrode 105. Second interconnect structure 114 can be connected to second electrode 107 and can extend to second side 106s2 of first dielectric layer 106. Third interconnect structure 116 can extend to second side 106s2 of first dielectric layer 106. In some embodiments, a top metal contact 114t of second interconnect structure 114 can have a top surface aligned with a top surface of first dielectric layer 106 on second side 106s2. A top metal contact 116t of third interconnect structure 116 can have a top surface aligned with a top surface of first dielectric layer 106 on second side 106s2. In some embodiments, top metal contacts 114t and 116t can function as bonding pads and can include redistributions layers (RDLs).

Figure 6:
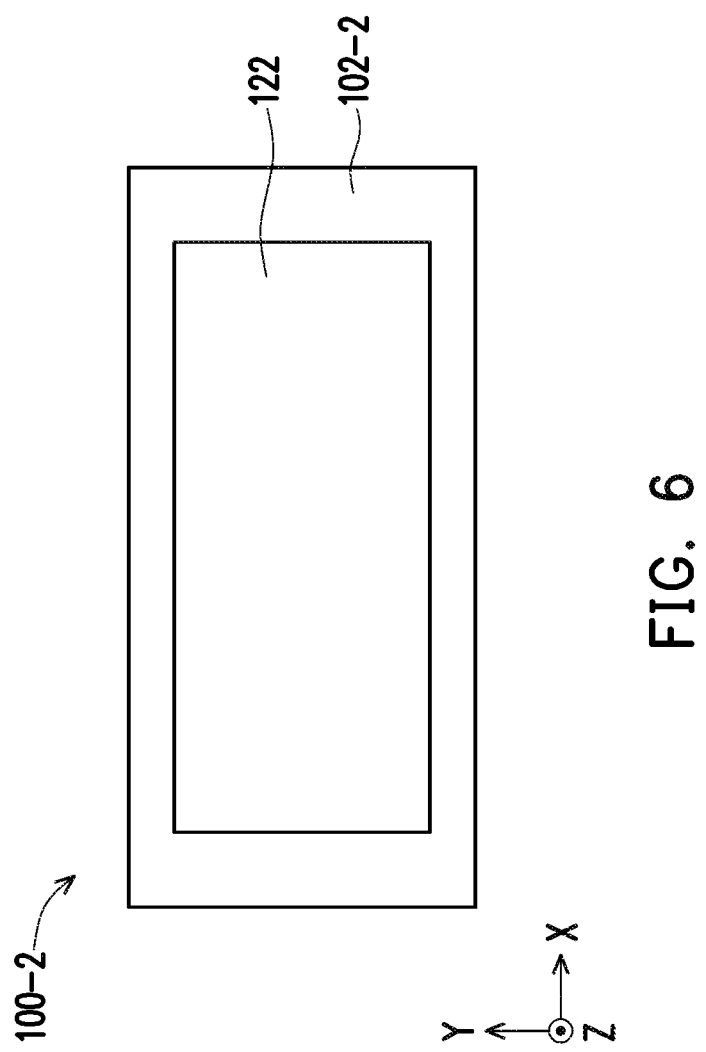
Figure 7:
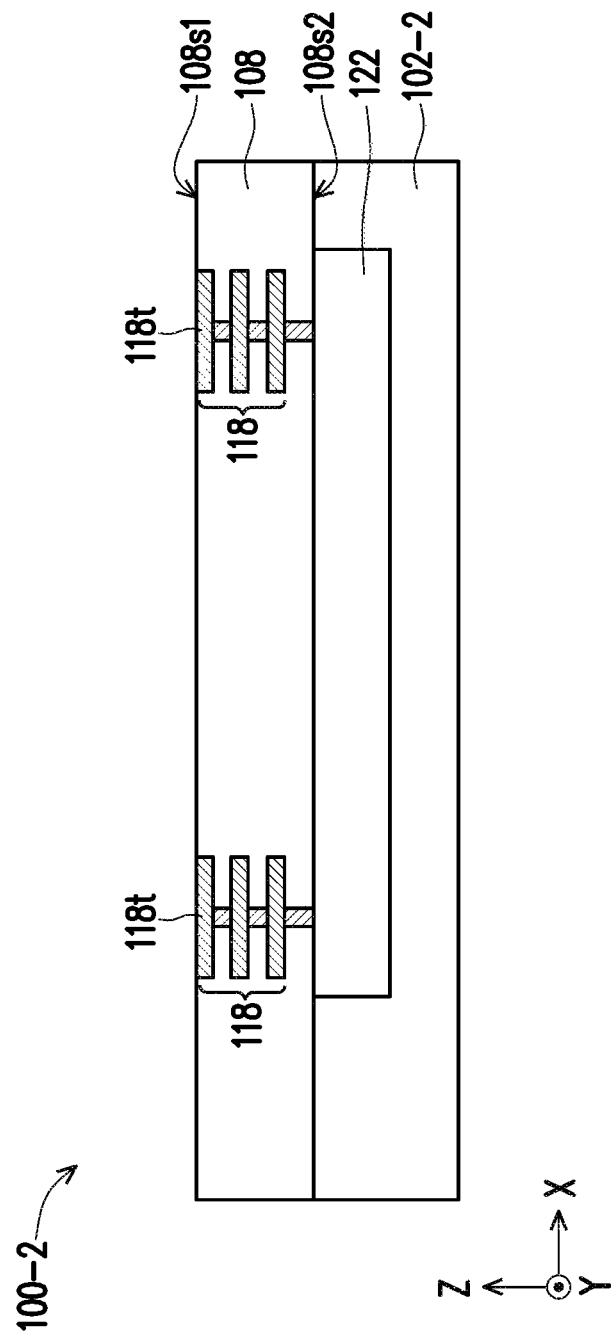

Referring to FIG. 3, in operation 320, a second dielectric layer and a fourth interconnect structure in the second dielectric layer can be formed on a second die. For example, as shown in FIGS. 6 and 7, second dielectric layer 108 and fourth interconnect structure 118 in second dielectric layer 108 can be formed on second die 100-2. FIGS. 6 and 7 illustrate a partial top view and a partial cross-sectional view of second die 100-2, respectively, in accordance with some embodiments. As shown in FIG. 6, associated circuits 122 for image signal processing can be formed on substrate 102-2. In some embodiments, substrate 102-2 can be a part of a bulk semiconductor wafer (e.g., a silicon wafer). In some embodiments, the partial top view and partial cross-sectional view of FIGS. 6 and 7 can illustrate an ASIC die to process image signals from a sensor die.

In some embodiments, associated circuits 122 can be formed on substrate 102-2 and can include one or more devices, such as MOSFETs, finFETs, GAA FETs, other active devices, and passive devices. Some devices of associated circuits 122 can form an I/O circuit to deliver the image signals from SPAD 103 to associated circuits 122 and deliver the control signals from associated circuits 122 to SPAD 103. Some devices of associated circuits 122 can form a core circuit to process image signals from SPAD 103 and control SPAD 103.

The formation of associated circuits 122 can be followed by formation of second dielectric layer 108 on substrate 102-2 and associated circuits 122. In some embodiments, second dielectric layer 108 can be deposited on substrate 102-2 and associated circuits 122 by PVD, CVD, FCVD, and other suitable deposition methods. In some embodiments, second dielectric layer 108 can include a dielectric material similar to or different from first dielectric layer 106. In some embodiments, second dielectric layer 108 can include one or more layers of dielectric materials.

The formation of second dielectric layer 108 can be followed by forming fourth interconnect structure 118. In some embodiments, second dielectric layer 108 can be etched to form via holes and/or metal trenches. The via holes and metal trenches can be filled with a conductive material to form metal vias and metal lines for fourth interconnect structure 118. In some embodiments, the metal vias and metal lines can be formed layer by layer, and each layer can be formed in a layer of dielectric material of second dielectric layer 108. In some embodiments, the metal vias and metal lines of fourth interconnect structure 118 can be formed using a deposition process and/or a plating process similar to the first, second, and third interconnect structures 112, 114, and 116 (e.g., electroplating, electro-less plating, etc.). In some embodiments, fourth interconnect structure 118 can include one or more layers of metal lines and/or metal vias. Fourth interconnect structure 118 can include a conductive material similar to first, second, and third interconnect structures 112, 114, and 116.

In some embodiments, fourth interconnect structure 118 can be formed in second dielectric layer 108 and can extend to first side 108$s$1 of second dielectric layer 108. In some embodiments, two top metal contacts 118$t$ of fourth interconnect structure 118 can have top surfaces aligned with a top surface of second dielectric layer 108 on first side 108$s$1. In some embodiments, top metal contacts 118$t$ can function as bonding pads and can include RDLs. Fourth interconnect structure 118 can be connected to associated circuits 122 on second side 108$s$2 of second dielectric layer 108.

Figure 8:
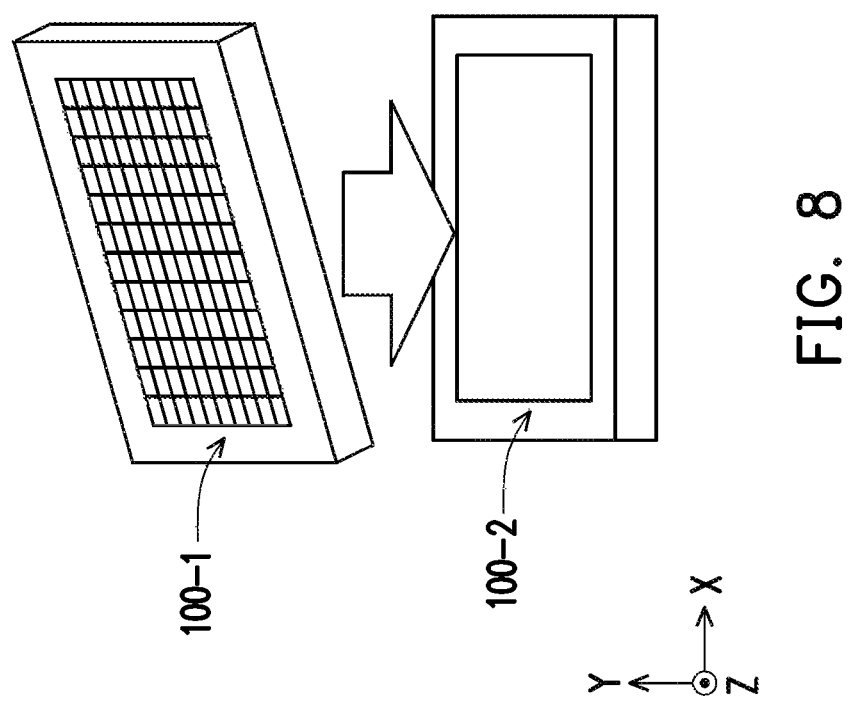
Figure 9:
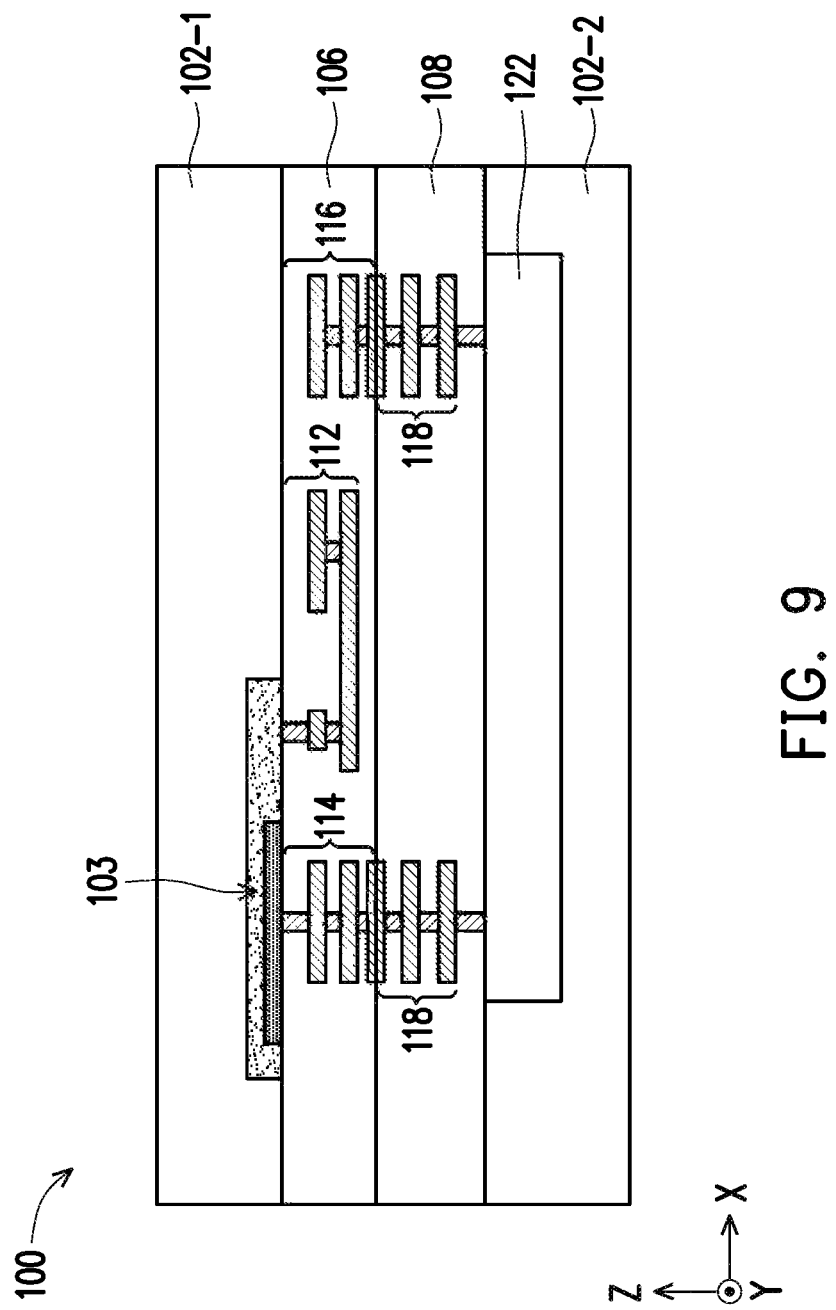

Referring to FIG. 3, in operation 330, the first dielectric layer is bonded to the second dielectric layer and the fourth interconnect structure connects the second and third interconnect structures. For example, as shown in FIGS. 8 and 9, first dielectric layer 106 can be bonded to second dielectric layer 108 and fourth interconnect structure 118 can connect second and third interconnect structures 114 and 116. In some embodiments, a first semiconductor wafer having first die 100-1 can be flipped over and placed on a second semiconductor wafer having second die 100-2. First side 108$s$1 of second dielectric layer 108 can be in contact with second side 106$s$2 of first dielectric layer 106 and top metal contacts 114$t$, 116$t$, and 118$t$ can be aligned to be in direct contact. In some embodiments, the bonding process can form a hybrid bond including a metal-to-metal bond and a dielectric-to-dielectric bond. Two top metal contacts 118$t$ can be bonded with top metal contacts 114$t$ and 116$t$ together to form a metal-to-metal bond. First side 108$s$1 of second dielectric layer 108 can be bonded with second side 106$s$2 of first dielectric layer 106 to form a dielectric-to-dielectric bond. In some embodiments, the dielectric-to-dielectric bond can be an oxide-to-oxide bond. In some embodiments, the bonding process can use an intermediate bonding oxide layer (not shown) on first side 108$s$1 of second dielectric layer 108 and second side 106$s$2 of first dielectric layer 106. With the hybrid bond, SPAD 103 on first die 100-1 can be coupled to associated circuits 122 on second die 100-2 through second and fourth interconnect structures 114 and 118.

In some embodiments, as shown in FIG. 2, second, third, and fourth interconnect structures 214, 216, and 218 may not extend to top surfaces of first and second dielectric layers 206 and 208. The bonding of first and second die 200-1 and 200-2 can form a dielectric-to-dielectric bond between first and second dielectric layers 206 and 208. First and second through vias 224 and 226 can be formed in first and second dielectric layers 206 and 208 to couple SPAD 203 on first die 200-1 and low-voltage power supply 220 to associated circuits 222 on second die 200-2, as shown in FIG. 2.

Figure 10:
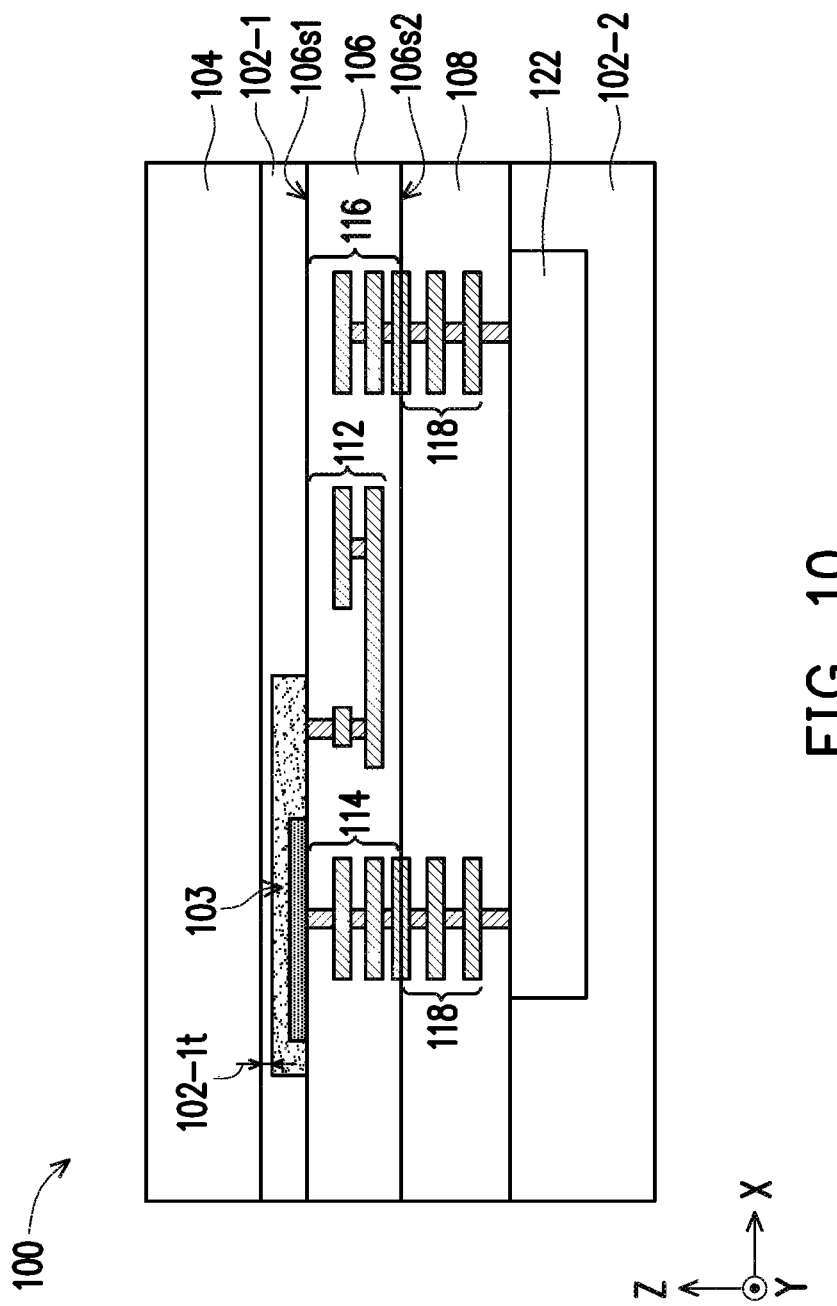

The bonding for first and second dielectric layers 106 and 108 can be followed by removing a portion of first die 100-1 on first side 106$s$1 of first dielectric layer 106 and formation of passivation layer 104 on first side 106$s$1, as shown in FIG. 10. A portion of substrate 102-1 can be removed to allow incident photons to pass through substrate 102-1 to SPAD 103. In some embodiments, substrate 102-1 can be thinned by mechanical grinding, chemical mechanical polishing (CMP), etching, and/or other suitable methods. In some embodiments, substrate 102-1 can be thinned to have a thickness 102-1$t$ above SPAD 103 ranging from about 1 nm to about 100 nm, as shown in FIG. 10. In some embodiments, substrate 102-1 can be thinned to expose SPAD 103 (not shown). After removing a portion of substrate 102-1, passivation layer 104 can be formed on substrate 102-1 and SPAD 103 on first side 106$s$1. Passivation layer 104 can be deposited by PVD, CVD, FCVD, and other suitable deposition methods. In some embodiments, passivation layer 104 can include a dielectric material, such as $SiO_x$, SiON, $SiN_x$, SiOC, SiOCN, and a combination thereof. Passivation layer 104 can passivate surfaces of substrate 102-1 and allow photons to pass through to SPAD 103.

Figure 11:
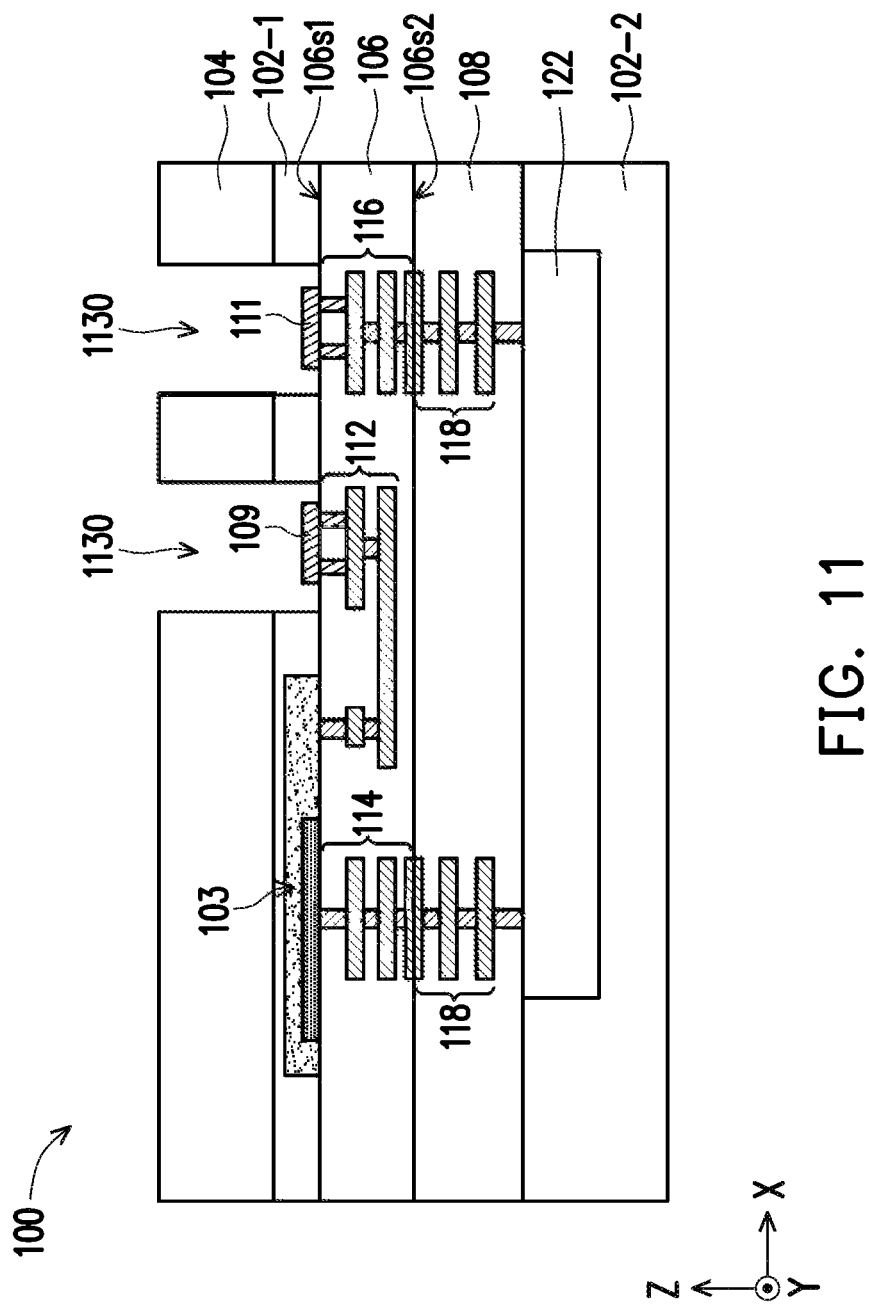

The formation of passivation layer 104 can be followed by forming first pad 109 connected to first interconnect structure 112 and second pad 111 connected to third interconnect structure 116 on first side 106$s$1 of first dielectric layer 106, as shown in FIG. 11. The formation of first pad 109 and second pad 111 can include etching of passivation layer 104, substrate 102-1, and first dielectric layer 106 and depositing a conductive material on first and third interconnect structures 112 and 116. Passivation layer 104, substrate 102-1, and first dielectric layer 106 can be etched in multiple steps to form openings 1130 and expose first and third interconnect structures 112 and 116. A conductive material can be deposited in openings 1130 in contact with first and third interconnect structures 112 and 116. In some embodiments, first and second pads 109 and 111 can include Al, TiN, TaN, W, Cu, AlCu, and other suitable conductive materials. In some embodiments, each of first and second pads 109 and 111 can have an area ranging from about 40×40 $\mu m^2$ to about 200×200 $\mu m^2$.

Figure 12:
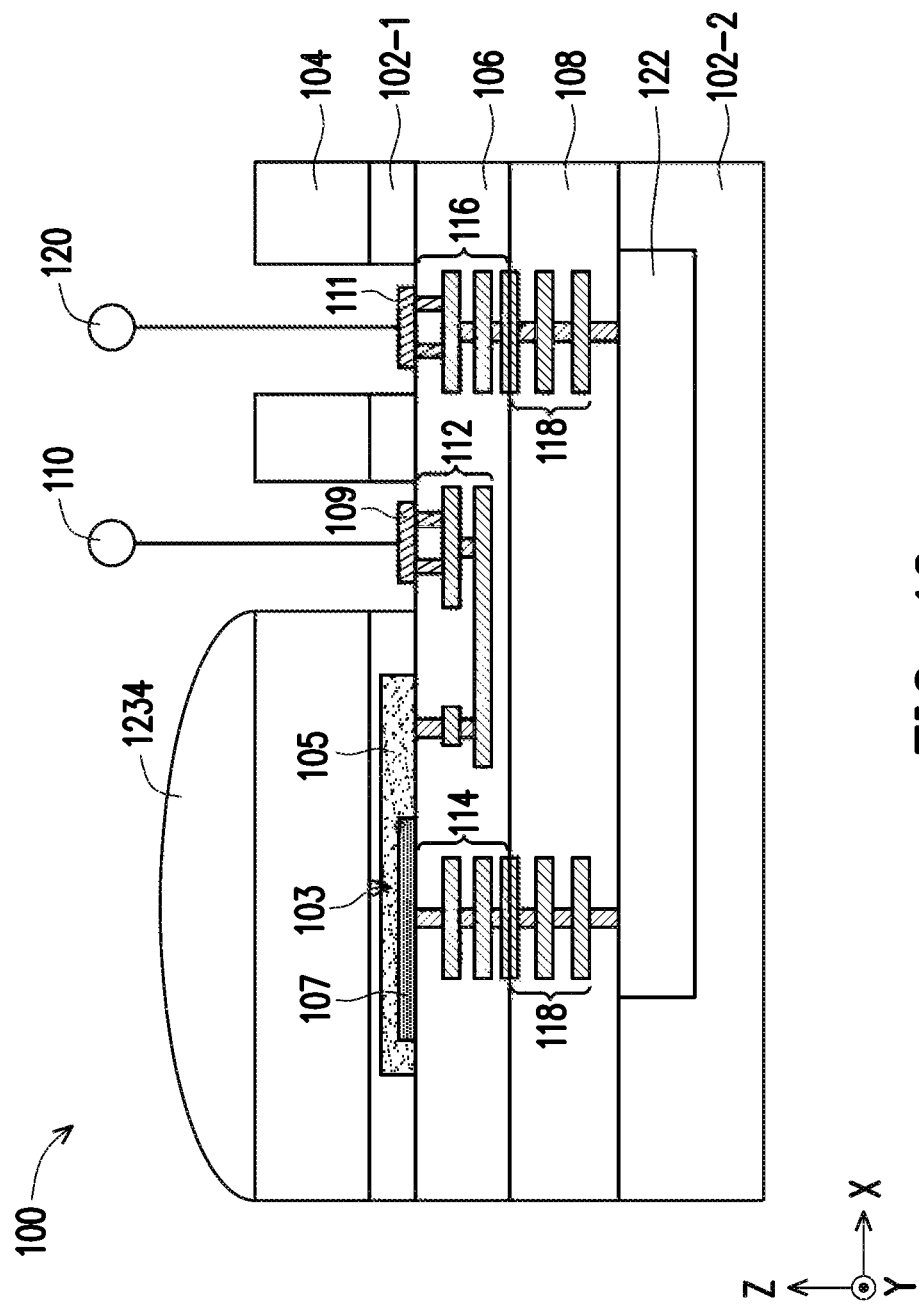

In some embodiments, the formation of first and second pads 109 and 111 can be followed by forming a micro-lens 1234 covering SPAD 103 on first side 106$s$1 of first dielectric layer 106, as shown in FIG. 12. In some embodiments, micro-lens 1234 can be formed by depositing a micro-lens material above SPAD 103 (e.g., by a spin-on method or a deposition process). A micro-lens template (not shown) having a curved upper surface can be patterned above the micro-lens material. In some embodiments, the micro-lens template can include a photoresist material exposed using a distributing exposing light dose (e.g., for a negative photoresist, more light is exposed at a bottom of the curvature and less light is exposed at a top of the curvature). The photoresist material can be developed and baked to form a curved shape. Micro-lens 1234 can be formed by selectively etching the micro-lens material according to the micro-lens template. In some embodiments, micro-lens 1234 can improve device performance of SPAD 103.

According to some embodiments, first pad 109 can connect first interconnect structure 112 to high-voltage power supply 110, as shown in FIG. 12. High-voltage power supply 110 can provide a high voltage (e.g., from about 15 V to about 40 V). First pad 109 and first interconnect structure 112 can provide the high voltage from high-voltage power supply 110 to first electrode 105 of SPAD 103. Second pad 111 can connect third interconnect structure 116 to low-voltage power supply 120, as shown in FIG. 12. Low-voltage power supply 120 can provide a low voltage (e.g., from about 0.5 V to about 3.0 V). Second pad 111, third interconnect structure 116, and fourth interconnect structure 118 can provide the low voltage from low-voltage power supply 120 to associated circuits 122. Accordingly, high-voltage routings of first interconnect structure 112 can remain in first die 100-1 and second die 100-2 can be free of high-voltage routings and may not process high-voltage operations. As a result, in some embodiments, second die 100-2 does not include high-voltage routings and the development of associated circuits 122 on second die 100-2 can avoid further qualification work for high-voltage metal verification and demonstration, which can reduce the development cycle time for semiconductor device 100. In addition, handling high-voltage metal routings on first die 100-1 with a different metal rule (e.g., associated with a higher technology node, such as above about 45 nm) can reduce manufacturing cost from handling both high-voltage and low-voltage metal routings on second die 100-2 with a restrictive metal rule (e.g., associated with a lower technology node, such as below about 45 nm).

Though the present disclosure describes the method for bonding first die 100-1 and second die 100-2 with a hybrid bond to keep high-voltage interconnect structures in first die 100-1, the methods can be applied to bonding first and second dies 200-1 and 200-2 with through vias to keep high-voltage interconnect structures in first die 200-1, and bonding other sensor dies and ASIC dies.

Various embodiments of the present disclosure provide example semiconductor devices 100 having first die 100-1 bonded to second die 100-2 with high-voltage first interconnect structure 112 in first die 100-1. According to some embodiments, first dielectric layer 106 of first die 100-1 can be bonded to second dielectric layer 108 of second die 100-2. First die 100-1 can include SPAD 103 having first electrode 105 and second electrode 107. First interconnect structure 112 and first pad 109 can connect first electrode 105 to high-voltage power supply 110 providing a high voltage (e.g., from about 15 V to about 40 V). Second die 100-2 can include fourth interconnect structure 118 connected to associated circuits 122. Second and fourth interconnect structures 114 and 118 can connect second electrode 107 to associated circuits 122. Third and fourth interconnect structures 116 and 118 and second pad 111 can connect associated circuits 122 to low-voltage power supply 120 providing a low voltage (e.g., from about 0.5 V to about 3.0 V). In some embodiments, associated circuits 122 can be connected to SPAD 103 and low-voltage power supply 120 using a hybrid bond between the first and second dies 100-1 and 100-2. In some embodiments, associated circuits 122 can be connected to SPAD 103 and low-voltage power supply 120 using first and second through vias 224 and 226 between the first and second dies 100-1 and 100-2. Accordingly, high-voltage routings of first interconnect structure 112 can remain in first die 100-1 and second die 100-2 can be free of high-voltage routings and may not process high-voltage operations. As a result, in some embodiments, the development of associated circuits 122 on second die 100-2 can avoid further high-voltage qualification work, which can reduce the development cycle time for semiconductor device 100. In addition, handling high-voltage metal routings on first die 100-1 and low-voltage metal routing on second die 100-2 can reduce manufacturing cost compared to handling both high-voltage and low-voltage metal routings on the same die.

In some embodiments, a semiconductor device includes a first die and a second die. The first die includes a first dielectric layer, a photodiode on a first side of the first dielectric layer and including a first electrode and a second electrode with a polarity opposite to that of the first electrode, a first interconnect structure enclosed in the first dielectric layer and connected to the first electrode, a second interconnect structure in the first dielectric layer and connected to the second electrode, and a third interconnect structure in the first dielectric layer and extending to the second side of the first dielectric layer. The second interconnect structure extends to a second side of the first dielectric layer. The second side is opposite to the first side of the first dielectric layer. The second die includes a second dielectric layer in contact with the second side of the first dielectric layer and a fourth interconnect structure in the second dielectric layer and extending to a side of the second dielectric layer. The fourth interconnect structure extends to the side of the second dielectric layer and connects the second and third interconnect structures.

In some embodiments, a semiconductor device includes a first die, a second die, a first through via, and a second through via. The first die includes a first dielectric layer, a photodiode on a first side of the first dielectric layer and including a first electrode and a second electrode with a polarity opposite to that of the first electrode, a first interconnect structure enclosed in the first dielectric layer and connected to the first electrode, a second interconnect structure in the first dielectric layer and connected to the second electrode, and a third interconnect structure in the first dielectric layer. The second electrode has a polarity opposite to the first electrode. The second die includes a second dielectric layer and a fourth interconnect structure in the second dielectric layer. The second dielectric layer is in contact with a second side of the first dielectric layer. The second side is opposite to the first side of the first dielectric layer. The first through via is in the first and second dielectric layers and connected to the second and fourth interconnect structures. The second through via is in the first and second dielectric layers and connected to the third and fourth interconnect structures.

In some embodiments, a method includes forming, on a first die, a first dielectric layer, a photodiode, a first interconnect structure, a second interconnect structure, and a third interconnect structure, and forming, on a second die, a second dielectric layer and a fourth interconnect structure in the second dielectric layer. The photodiode is on a first side of the first dielectric layer and includes a first electrode and a second electrode with a polarity opposite to that of the first electrode. The first interconnect structure is formed within the first dielectric layer and connected to the first electrode. The first interconnect structure does not extend to a second side of the first dielectric layer. The second side is opposite to the first side of the first dielectric layer. The second interconnect structure is formed in the first dielectric layer and connected to the second electrode. The second interconnect structure extends to the second side of the first dielectric layer. The third interconnect structure is formed in the first dielectric layer and extends to the second side of the first dielectric layer. The fourth interconnect structure extends to a side of the second dielectric layer. The method further includes bonding the first die at the second side of the first dielectric layer to the second die at the side of the second dielectric layer. The fourth interconnect structure connects the second and third interconnect structures.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a first die, comprising:
  a first dielectric layer;
  a photodiode on a first side of the first dielectric layer and comprising a first electrode and a second electrode with a polarity opposite to that of the first electrode;
  a first interconnect structure enclosed in the first dielectric layer and connected to the first electrode;
  a second interconnect structure in the first dielectric layer connected to the second electrode, wherein the second interconnect structure extends to a second side of the first dielectric layer and the second side being opposite to the first side of the first dielectric layer; and
  a third interconnect structure in the first dielectric layer extending to the second side of the first dielectric layer; and
 a second die, comprising:
  a second dielectric layer in contact with the second side of the first dielectric layer; and
  a fourth interconnect structure in the second dielectric layer extending to a side of the second dielectric layer, wherein the fourth interconnect structure connects the second interconnect structure to the third interconnect structure, and wherein the first interconnect structure is separated from the second die by the first dielectric layer.

2. The semiconductor device of claim 1, further comprising a pad on the first side of the first dielectric layer and connected to the first interconnect structure.

3. The semiconductor device of claim 1, further comprising a pad on the first side of the first dielectric layer and connected to the third interconnect structure.

4. The semiconductor device of claim 1, further comprising a micro-lens covering the photodiode on the first side of the first dielectric layer.

5. The semiconductor device of claim 1, further comprising a passivation layer over the photodiode on the first side of the first dielectric layer.

6. The semiconductor device of claim 1, wherein the fourth interconnect structure is in contact with the second and third interconnect structures on the second side of the first dielectric layer.

7. The semiconductor device of claim 1, wherein each of the first, second, third, and fourth interconnect structures comprises one or more metal lines and metal vias.

8. The semiconductor device of claim 1, wherein the fourth interconnect structure is connected to one or more devices on the second die.

9. A semiconductor device, comprising:
 a first die, comprising:
  a first dielectric layer;
  a photodiode on a first side of the first dielectric layer and comprising a first electrode and a second electrode with a polarity opposite to that of the first electrode;
  a first interconnect structure enclosed in the first dielectric layer and connected to the first electrode;
  a second interconnect structure in the first dielectric layer connected to the second electrode; and
  a third interconnect structure in the first dielectric layer;
 a second die, comprising:
  a second dielectric layer; and
  a fourth interconnect structure in the second dielectric layer, wherein the second dielectric layer is in contact with a second side of the first dielectric layer, the second side being opposite to the first side of the first dielectric layer;
 a first through via in the first and second dielectric layers connected to the second and fourth interconnect structures; and
 a second through via in the first and second dielectric layers connected to the third and fourth interconnect structures, wherein the first and second through vias extend through the first dielectric layer.

10. The semiconductor device of claim 9, further comprising a first pad on the first side of the first dielectric layer and connected to the first interconnect structure, wherein the first pad is connected to a power supply providing a voltage from about 15 V to about 40 V.

11. The semiconductor device of claim 9, further comprising a second pad on the first side of the first dielectric layer and connected to the third interconnect structure, wherein the second pad is connected to a power supply providing a voltage from about 0.5 V to about 3.0 V.

12. The semiconductor device of claim 9, further comprising a micro-lens covering the photodiode on the first side of the first dielectric layer.

13. The semiconductor device of claim 9, further comprising a passivation layer over the photodiode on the first side of the first dielectric layer.

14. The semiconductor device of claim 9, wherein the first and second through vias extend through the first dielectric layer and into the second dielectric layer.

15. The semiconductor device of claim 9, wherein each of the first, second, third, and fourth interconnect structures comprises one or more metal lines and metal vias.

16. The semiconductor device of claim 9, wherein the fourth interconnect structure is connected to one or more devices on the second die.

17. A semiconductor device, comprising:
a first dielectric layer;
a photodiode on a first side of the first dielectric layer and comprising a first electrode and a second electrode having a polarity opposite to that of the first electrode;
a first interconnect structure in the first dielectric layer and electrically connecting the first electrode to a first power supply, wherein the first interconnect structure comprises a first end connected to the first electrode and a second end extending towards the first side of the first dielectric layer;
a second interconnect structure in the first dielectric layer and connected to the second electrode;
a third interconnect structure in the first dielectric layer and connected to a second power supply;
a second dielectric layer in contact with a second side of the first dielectric layer, wherein the second side is opposite to the first side; and
a fourth interconnect structure in the second dielectric layer and electrically connected to the second interconnect structure and the third interconnect structure.

18. The semiconductor device of claim 17, further comprising a pad on the first side of the first dielectric layer and connecting the first interconnect structure to the first power supply.

19. The semiconductor device of claim 17, further comprising a pad on the first side of the first dielectric layer and connecting the third interconnect structure to the second power supply.

20. The semiconductor device of claim 17, further comprising a passivation layer over the photodiode on the first side of the first dielectric layer.

* * * * *